United States Patent
Lu (12)

(10) Patent No.: US 6,538,499 B1
(45) Date of Patent: Mar. 25, 2003

(54) LOW JITTER TRANSMITTER ARCHITECTURE WITH POST PLL FILTER

(75) Inventor: Jinghui Lu, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/043,717

(22) Filed: Jan. 9, 2002

(51) Int. Cl.[7] .................................. H03L 7/06
(52) U.S. Cl. .................. 327/557; 327/156; 327/311
(58) Field of Search .................. 327/156, 157, 327/292, 293, 295, 311, 329, 552, 553, 557; 331/74, 77

(56) References Cited

U.S. PATENT DOCUMENTS

| | | | | |
|---|---|---|---|---|
| 5,072,200 A | * | 12/1991 | Ranky | .................. 327/552 |
| 5,568,098 A | * | 10/1996 | Horie et al. | ................. 327/156 |
| 5,870,002 A | * | 2/1999 | Ghaderi et al. | ............. 327/156 |
| 6,057,740 A | * | 5/2000 | Consolazio et al. | .......... 331/25 |
| 6,356,156 B2 | * | 3/2002 | Wesolowski | ................. 331/10 |
| 6,453,157 B1 | * | 9/2002 | Roberts | ...................... 333/176 |

* cited by examiner

*Primary Examiner*—Timothy P. Callahan
*Assistant Examiner*—Terry L. Englund
(74) *Attorney, Agent, or Firm*—Edward S. Mao; Kim Kanzaki

(57) ABSTRACT

A post PLL filter is coupled to the output terminal of a phase locked loop. The post PLL filter reduces the jitter of the PLL output clock signal by increasing the Q of the phase locked loop. In addition, some embodiments of the present invention also provides amplitude magnification of the PLL output clock signal.

10 Claims, 5 Drawing Sheets

LOW JITTER TRANSMITTER ARCHITECTURE WITH POST PLL FILTER

FIELD OF THE INVENTION

The present invention relates to clocking circuits for digital systems. More specifically, the present invention relates to a clocking circuit using a filter to provide low jitter clock signals.

BACKGROUND OF THE INVENTION

Clock signals are used for a variety of purpose in digital circuits on both board level systems and integrated circuit (IC) devices, such as transceivers, field programmable gate arrays (FPGAs) and microprocessors. For example, in transceivers, clock signals are used to clock out data bits. Clock signals are typically generated using a phase locked loop (PLL).

FIG. 1 shows a conventional phase locked loop 100 used to generate a PLL output clock signal PLL_O_CLK. Phase locked loop 100 receives a reference clock signal REF_CLK having a frequency F_REF and generates a PLL output clock signal PLL_O_CLK having a frequency F_OUT, where F_OUT is equal to frequency F_REF multiplied by a multiplier, i.e. F_OUT=F_REF*M. Phase locked loop 100 comprises a phase and frequency comparator 110, a charge pump 120, a voltage controlled oscillator (VCO) 140, and a clock divider 150. Clock divider 150 divides PLL output clock signal PLL_O_CLK to generate a feedback clock signal FBK_CLK having a frequency F_FBK equal to frequency F_OUT divided by M.

Phase and frequency comparator 110 compares the phase and frequency of feedback clock FBK_CLK to the phase and frequency of reference clock signal REF_CLK. Specifically, if an active edge of feedback clock signal FBK_CLK leads an active edge of reference clock signal REF_CLK, frequency comparator 110 causes charge pump 120 to decrease the voltage level of VCO control signal VCO_C, which is coupled to voltage controlled oscillator 140, to reduce frequency F_OUT of PLL output clock signal PLL_O_CLK, which is generated by voltage controlled oscillator 140. Conversely, if an active edge of feedback clock signal FBK_CLK lags an active edge of reference clock signal REF_CLK, frequency comparator 110 causes charge pump 120 to increase the voltage level of VCO control signal VCO_C to increase frequency F_OUT of PLL output clock signal PLL_O_CLK. Thus, eventually, the phase and frequency of feedback clock signal FBK_CLK is nearly equal to the phase and frequency of reference clock signal REF_CLK. As explained above, frequency F_FBK of feedback clock signal FBK_CLK is equal to frequency F_OUT of PLL output clock signal PLL_O_CLK divided by M, i.e., F_FBK=F_OUT/M. Thus, frequency F_OUT of PLL output clock signal PLL_O_CLK is equal to frequency F_REF of reference clock signal REF_CLK multiplied by M, i.e., F_OUT=F_REF*M. Generally, PLL output clock signal PLL_O_CLK would be provided to a clock buffer (not shown) and then distributed to the other components of the chip or system.

As explained above, phase locked loop 100 converges on the proper phase and frequency for PLL output clock signal PLL_O_CLK by controlling voltage controlled oscillator 140. In general, phase locked loop 100 can not perfectly align the phase and frequency of feedback clock signal FBK_CLK with the phase and frequency of reference clock signal REF_CLK, due to finite phase locked loop bandwidth. Instead, frequency F_FBK bounces around a very narrow range around frequency F_REF. Consequently, frequency F_OUT of PLL output clock signal PLL_O_CLK bounces around a very narrow range around M times frequency F_REF. The slight changes in frequency F_OUT causes jitter on PLL clock signal PLL_O_CLK. If frequency F_OUT is small, i.e. the clock period is long, the small jitter in PLL output clock signal PLL_O_CLK can typically be ignored. However, if frequency F_OUT of PLL output clock signal PLL_O_CLK is high and the clock period of PLL output clock signal PLL_O_CLK is small, the jitter in PLL output clock signal PLL_O_CLK may be a significant portion of the clock period. Generally, the jitter must be reduced to a small portion of the clock period otherwise serious problems may develop in a high-speed chip or system. Hence, there is a need for a clock generating system, which minimizes jitter in an output clock signal.

SUMMARY

Accordingly, a post PLL filter is coupled to the output terminal of a phase locked loop. The post PLL filter reduces the jitter of the PLL output clock signal by increasing the Q (wherein Q is the quality factor) of the phase locked loop. In addition, some embodiments of the present invention also provide amplitude magnification of the PLL output clock signal.

In accordance with one embodiment of the present invention, the post PLL filter is an active band pass filter using complementary input and output signals. The active band pass filter uses the inherent capacitance on the output clock lines rather than requiring additional capacitors. By using the inherent capacitance on the output clock lines, the active band pass filter provides amplitude magnification at the desired clock frequency. The PLL output clock signal is received on the control terminals of two input transistors. A pair of inductors coupled in series between a P output terminal and an N output terminal provides the inductance of the active band pass filter. A pair of cross coupled transistors provide negative Gm and boosts the Q factor of the active band pass filter. A varacter coupled between the P output terminal and the N output terminal can be used to tune the active band pass filter. In a second embodiment of the present invention, the post PLL filter includes multiple band pass filters to further boost the output clock signal.

The present invention will be more fully understood in view of the following description and drawings.

DETAILED DESCRIPTION

As explained above, conventional clock circuits using PLLs generate jittery output clock signals. While the jitter is typically quite small, in high frequency clock signals with small clock periods, even small jitter becomes a large portion of the clock period. To avoid synchronization problems, jitter should be reduced to a very small portion of the clock period. The present invention minimizes the jitter of a phase locked loop by using a post PLL filter. Furthermore, in some embodiments of the present invention, the post PLL filters also boosts the amplitude of the clock signal at the desired frequency of the clock signal.

Figure 1:
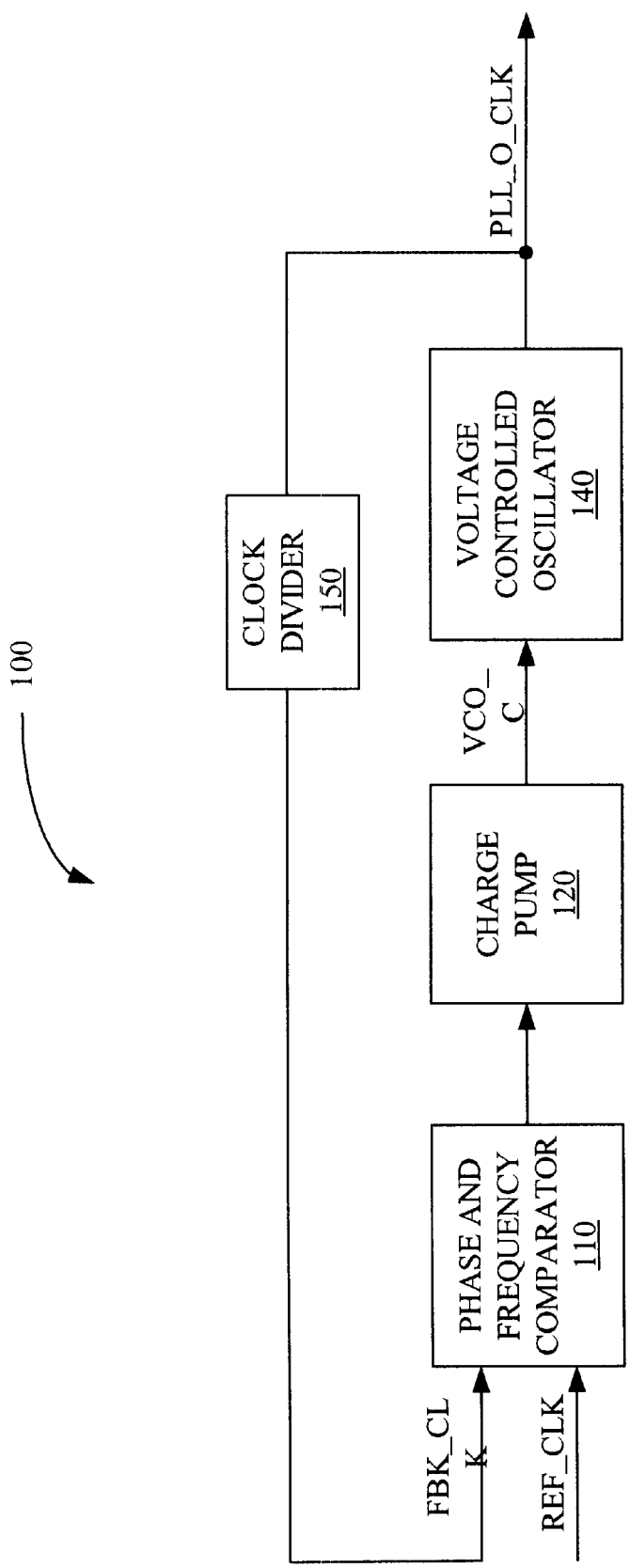
FIGS. 1 is a block diagram of a conventional phase locked loop.
Figure 2:
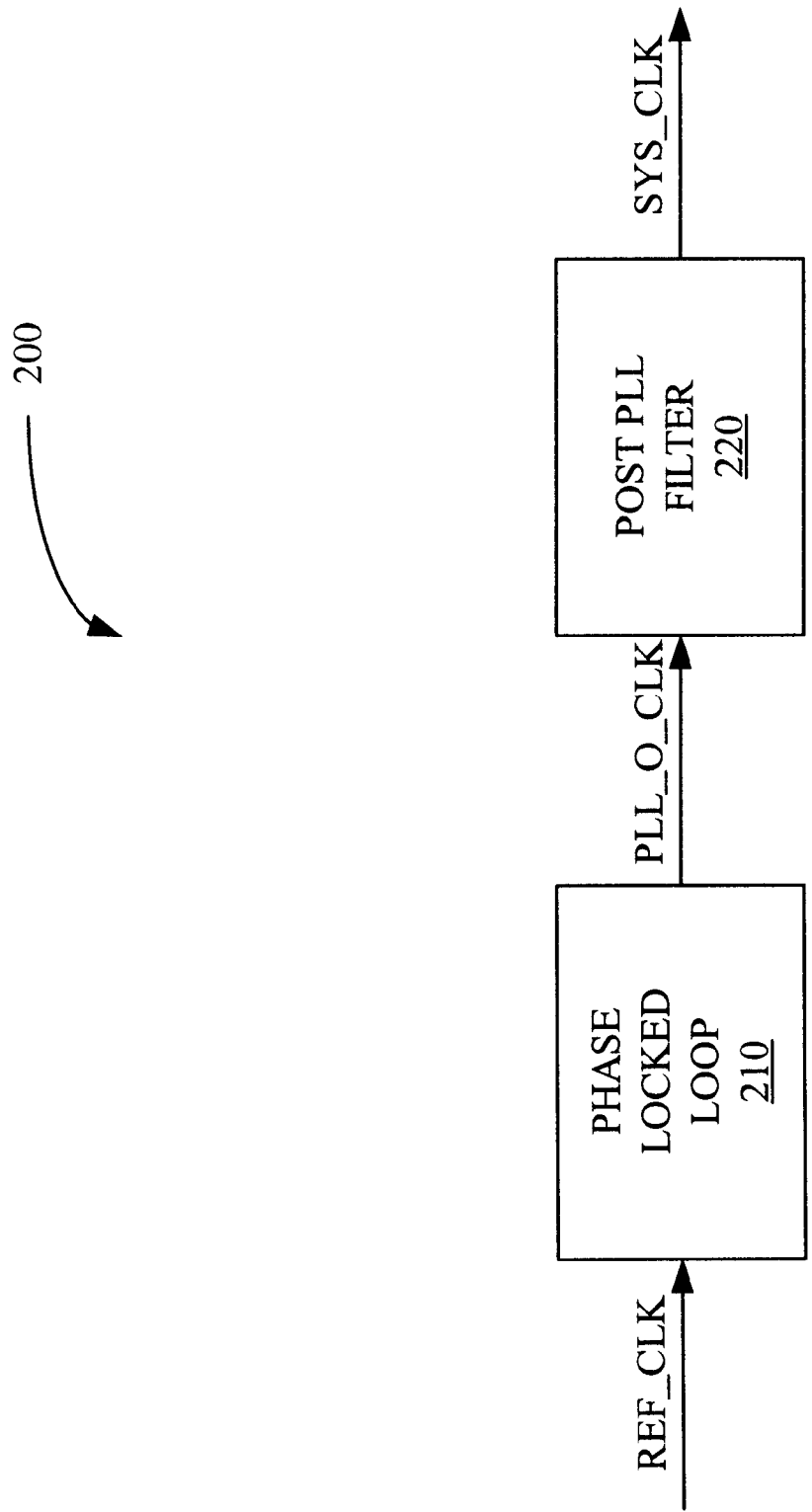
FIG. 2 is a block diagram of a clock circuit in accordance with one embodiment of the present invention.

FIG. 2 is a block diagram of a clock circuit 200 in accordance with one embodiment of the present invention. Clock circuit 200 includes a phase locked loop (PLL) 210 and a post PLL filter 220. Phase locked loop 210, which can be of conventional design, receives a reference clock signal REF_CLK and generates a PLL output clock signal PLL_O_CLK. Post PLL filter 220 receives PLL output clock signal PLL__CLK and generates a system clock signal SYS_CLK which can be used to drive other devices on the chip or in the system using clock circuit 200.

Figure 3:
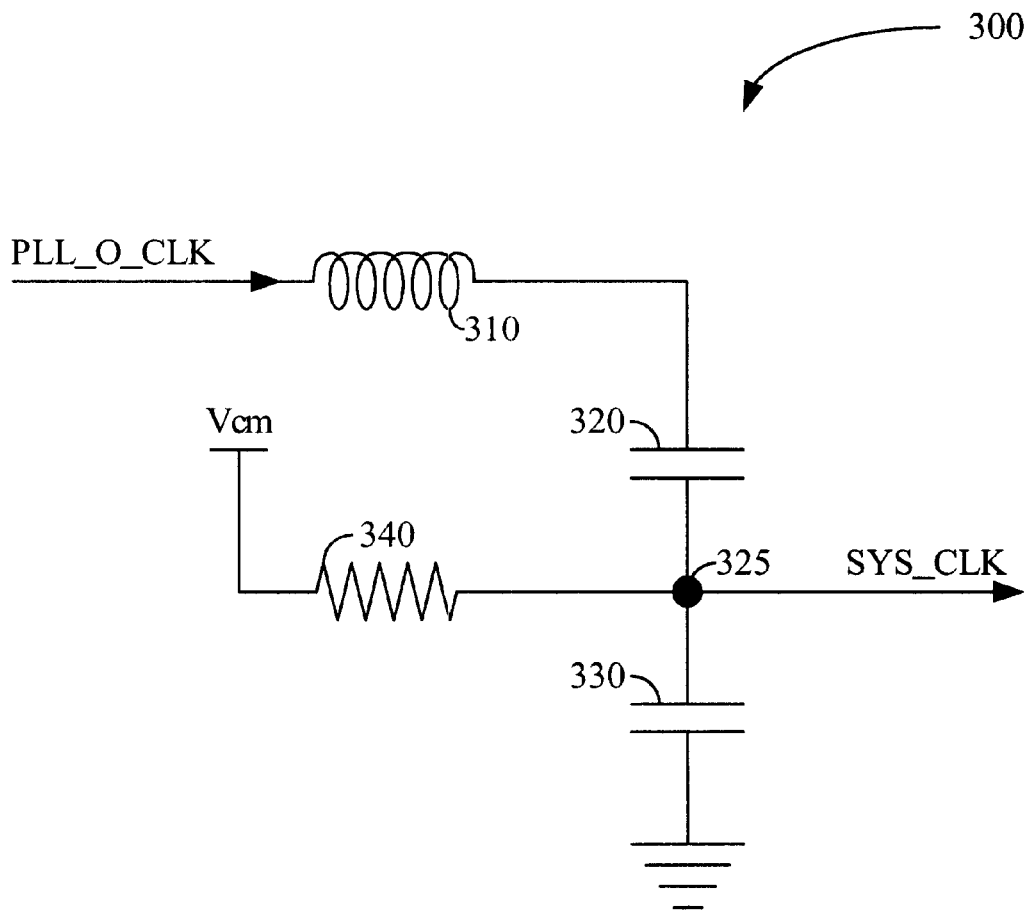
FIG. 3 is a circuit diagram of a post PLL filter in accordance with one embodiment of the present invention.

As explained above post PLL filter 220 reduces jitter in system clock signal SYS_CLK as compared to PLL output clock signal PLL_O_CLK. Suppressing jitter, which can be modeled as phase noise, can be accomplished by using a band pass filter tuned to the desired frequency of system clock signal SYS_CLK. FIG. 3 shows a passive band pass filter 300, which could be used as post PLL filter 220. Passive band pass filter 300 includes an inductor 310, a first capacitor 320, a second capacitor 330, and a resistor 340. PLL output clock signal PLL_O_CLK is provided to a first terminal of inductor 310. The second terminal of inductor 310 is coupled to ground through capacitor 320 and capacitor 330, which are connected in series with a node 325 between capacitors 320 and 330. Resistor 340 is coupled between a common mode voltage Vcm and node 325. System clock signal SYS_CLK is driven at node 325. Passive band pass filter 300 can be tuned to the desired frequency of system clock signal SYS_CLK by adjusting the ratio of the capacitances of capacitors 330 and 320. For example, increasing the ratio of the capacitances of capacitor 330 and 320 increases the frequency of passive band pass filter 300.

In addition to jitter problems, clock circuits using phase locked loops also have trouble driving large loads at high frequencies. For example, conventional clock circuits using a large clock buffer has trouble delivering large amplitude swings due to the parasitic resistances and capacitances on the clock lines, as well as the various circuits coupled to the clock line. Therefore, in some embodiments of the present invention, the post PLL filter uses the inherent capacitance on the clock line caused by parasitic capacitance of the clock line itself, the parasitic capacitances of the circuits coupled to the clock line, as well as the capacitances of the elements in the post PLL filter instead of requiring additional capacitors. By using the inherent capacitance for filtering, the inductance of the post PLL filter can boost the amplitude of the system clock signal at the desired frequency of the system clock signal.

Figure 4:
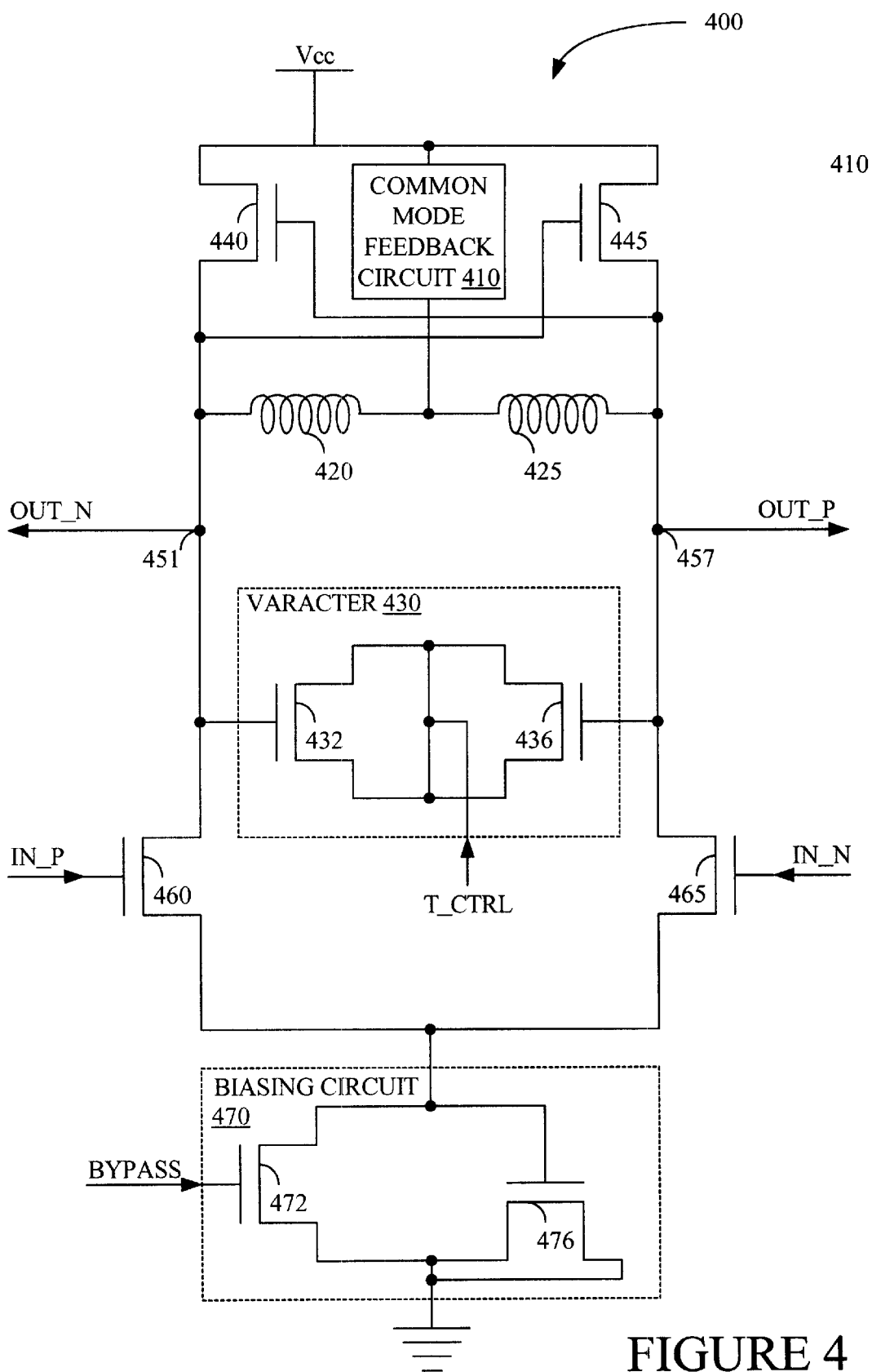
FIG. 4 is a circuit diagram of a post PLL filter in accordance with one embodiment of the present invention.

FIG. 4 is a circuit diagram of an active band pass filter 400 which can be used as post PLL filter 220 (FIG. 2) for both filtering jitter and boosting amplitude. Active band pass filter 400 includes a common mode feedback circuit 410, inductors 420 and 425, a varacter 430, a biasing circuit 470, and transistors 440, 445, 460, and 465. Active band pass filter 400 is designed to be used with CMOS systems having complementary input and output signals. Thus, active band pass filter 400 receives both a P input signal IN_P and an N input signal IN_N. Similarly, active band pass filter 400 generates a P output signal OUT_P and an N output signal OUT_N. P input signal IN_P and N input signal IN_N are received on the control terminal of transistor 460 and 465, respectively. N output signal OUT_N and P output signal OUT_P are provided at nodes 451 and 457, respectively.

Inductors 420 and 425 provide the inductance of active band pass filter 400. As explained above, the inherent capacitance on the output lines of active band pass filter 400 is used as the capacitance of active band pass filter 400. For active band pass filter 400, the inherent capacitance includes the parasitic capacitance of the output lines, the parasitic capacitance of the circuits on the output lines, and the parasitic capacitance from transistors 440, 445, 460, 465, and varacter 430. Transistors 440 and 445 are cross-coupled to provide negative Gm and to boost the Q factor of active band pass filter 400. Specifically, transistor 440 has a first power terminal coupled to the positive power supply VCC and a second power terminal coupled to the control terminal of transistor 445. Similarly, transistor 445 has a first power terminal coupled to the positive power supply VCC and a second power terminal coupled to the control terminal of transistor 440. Inductors 420 and 425 are coupled in series between the second power terminals of transistors 440 and 445. Common mode feedback circuit 410 is coupled between the positive power supply VCC and inductors 420 and 425. Common mode feedback circuit 410 provides voltage biasing for transistors 440 and 445. Node 451, which provides N output signal OUT_N, is coupled to the second power terminal of transistor 440. Node 457, which provides P output signal OUT_P, is coupled to the second power terminal of transistor 445.

Varactor 430 is used to tune active band pass filter 400 to the desired frequency of the input clock signal using a tuning control signal T_CTRL. Varactor 430 is coupled in between the second power terminals of transistors 440 and 445. In the embodiment of FIG. 4, varactor 430 includes transistors 432 and 436. The control terminal of transistor 432 is coupled to the second power terminal of transistor 440. Similarly, the control terminal of transistor 436 is coupled to the second power terminal of transistor 445. The first power terminal of transistor 432 is coupled to the first power terminal of transistor 436. The second power terminal of transistor 432 is coupled to the second power terminal of transistor 436. Tuning control signal T_CTRL is provided at the first and second power terminals of transistors 432 and 436.

As stated above input transistors 460 and 465 receive P input signal IN_P and N input signal IN_N on the control terminals of transistors 460 and 465, respectively. The first power terminal of input transistor 460 is coupled to the second power terminal of transistor 440. Similarly, the first power terminal of transistor 465 is coupled to the second power terminal of transistor 445. The second power terminals of transistors 460 and 465 are coupled together to ground through a biasing circuit 470. Biasing circuit 470 includes a transistor 472 and a transistor 476. Transistor 472 has a control terminal receiving a bypass control signal BYPASS, a first power terminal coupled to the second power terminals of transistors 460 and 465, and a second power terminal coupled to ground. Transistor 472 can be used to disable active band pass filter 400 by driving bypass control signal BYPASS to a logic high voltage level. Transistor 476, which is used as a capacitor to provide noise filtering, has a control terminal coupled to the second power terminal of transistors 460 and 465, a first power terminal coupled to ground, and a second power terminal coupled to ground. In other embodiments of the present invention, biasing circuit 470 could be for example a current mirrored bias circuit.

The inductance values of inductors 420 and 425 are determined based on the inherent capacitance on the output signals, the desired resonant frequency of the output signal, and the frequency of the input signal using conventional techniques. For example, in one embodiment of the present invention for an input clock signal at a frequency of 5 gigahertz and inherent total capacitance of 1.2 puf, the total inductance of inductors 420 and 425 would be 0.83 nH. In this embodiment the common mode voltage is approximately 1.0 volt with a positive power supply voltage Vcc of 1.8 volts.

In addition to jitter reduction, active band pass filter 400 provides some additional benefits, such as reducing phase error and DC phase skew. Specifically, a DC phase skew between input signals IN_P and IN_N would be reduced on output signals OUT_P and OUT_N.

Figure 5:
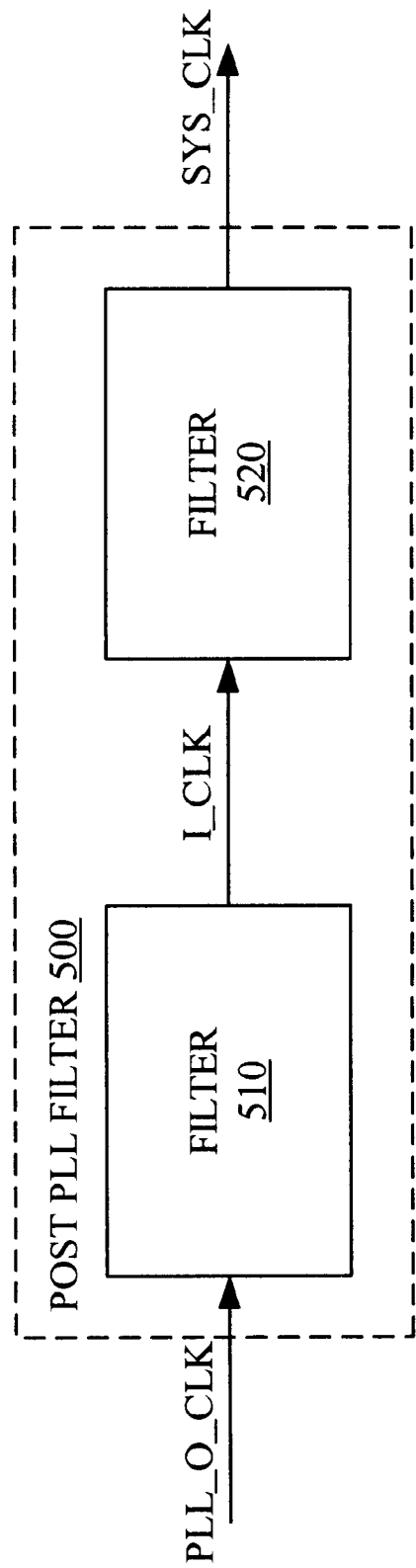
FIG. 5 is a circuit diagram of a post PLL filter in accordance with one embodiment of the present invention.

FIG. 5 shows a block diagram of a post PLL filter 500 in accordance with another embodiment of the present invention. Post PLL filter 500 includes a first filter 510 and a second filter 520. Filters 510 and 520 are coupled in series. Specifically, filter 510 receives PLL output clock signal PLL_O_CLK and drives a filtered intermediate clock signal I_CLK to filter 520. Filter 520 further filters filtered intermediate clock signal I_CLK to generate system clock signal SYS_CLK. The primary benefit of using multiple filters in series is to derive larger amplitude gains. For example, filter 510 amplifies the amplitude of PLL output clock signal PLL_O_CLK in generating filtered intermediate clock signal I_CLK. Then filter 520 further amplifies the amplitude of filtered intermediate clock signal I_CLK to generate system clock signal SYS_CLK. Some embodiments of the present invention may include additional filters to further boost the amplitude of the output clock signal.

In the various embodiments of this invention, novel structures and methods have been described to reduce jitter and boost amplitudes of clock signals by adding a post PLL filter to a PLL based clock circuit. Specifically, jitter is reduced by using band pass filters around the desired frequency of the clock signal. The amplitude of the clock signal can be boosted by using the inherent capacitance on the clock line for the post PLL filter and allowing the inductance of the filter to boost the amplitude. The various embodiments of the structures and methods of this invention that are described above are illustrative only of the principles of this invention and are not intended to limit the scope of the invention to the particular embodiments described. For example, in view of this disclosure, those skilled in the art can define other phase locked loops, post PLL filters, passive band pass filters, active band pass filters, varactors, inductors, resistors, biasing circuits, and so forth, and use these alternative features to create a method or system according to the principles of this invention. Thus, the invention is limited only by the following claims.

What is claimed is:

1. A clock circuit for generating a system clock signal, the clock circuit comprising:
   a phase locked loop generating a PLL output clock signal;
   a post PLL filter coupled to receive the PLL output clock signal and to generate the system clock signal;
   wherein the post PLL filter comprises:
   a P input terminal;
   an N input terminal;
   a P output terminal;
   and an N output terminal;
   a first inductor coupled to the P output terminal; and
   a second inductor coupled in series with the first inductor between the P output terminal and the N output terminal.

2. The clock circuit of claim 1, wherein the post PLL filter further comprises:
   a first input transistor having a control terminal coupled to the P input terminal, a first power terminal coupled to the second inductor, and a second power terminal; and
   a second input transistor having a control terminal coupled to the N input terminal, a third power terminal coupled to the first inductor, and a fourth power terminal coupled to the second power terminal of the first input transistor.

3. The clock circuit of claim 2, wherein the post PLL filter further comprises:
   a first transistor having a first power terminal coupled to a positive power supply, a second power terminal coupled to the P output terminal, and a control terminal coupled to the N output terminal; and
   a second transistor having a first power terminal coupled to the positive power supply, a second power terminal coupled to the N output terminal, and a control terminal coupled to the P output terminal.

4. The clock circuit of claim 3, wherein the post PLL filter further comprises a varacter coupled between the P output terminal and the N output terminal.

5. The clock circuit of claim 4, wherein the post PLL filter further comprises a common mode feedback circuit coupled between the positive power supply and the first inductor.

6. The clock circuit of claim 5, wherein the post PLL filter further comprises a biasing circuit coupled between the second power terminal of the first input transistor and ground.

7. The clock circuit of claim 6, wherein the biasing circuit comprises a bypass transistor having a fifth power terminal coupled to the second power terminal of the first input transistor, and a sixth power terminal coupled to ground.

8. The clock circuit of claim 1, wherein said post PLL filter is an active bandpass filter.

9. A method to generate a system clock signal comprising:
   generating a PLL output clock signal and a complementary PLL output clock signal from a reference clock signal; and
   using a plurality of series connected inductors, coupled to the system clock signal and a complementary system clock signal, for filtering the PLL output clock signal and the complementary PLL output clock signal to generate the system clock signal.

10. The method of claim 9, wherein the filtering the PLL output clock signals to generate the system clock signal comprises:
    filtering the PLL output clock signal to generate a filtered intermediate clock signal; and
    filtering the intermediate clock signal to generate the system clock signal.

* * * * *